(12) United States Patent
Eboshi et al.

(10) Patent No.: US 11,939,667 B2
(45) Date of Patent: Mar. 26, 2024

(54) METHOD FOR MANUFACTURING WAVELENGTH CONVERSION MEMBER AND LIGHT EMITTING DEVICE

(71) Applicant: NICHIA CORPORATION, Anan (JP)

(72) Inventors: Naoki Eboshi, Tokushima (JP); Hiroaki Yuto, Awa (JP); Hiroki Sakata, Tokushima (JP); Toshiaki Yamashita, Komatsushima (JP); Akinori Hara, Anan (JP)

(73) Assignee: NICHIA CORPORATION, Anan (JP)

( * ) Notice: Subject to any disclaimer, the term of this patent is extended or adjusted under 35 U.S.C. 154(b) by 543 days.

(21) Appl. No.: 17/230,763

(22) Filed: Apr. 14, 2021

(65) Prior Publication Data

US 2021/0332475 A1    Oct. 28, 2021

(30) Foreign Application Priority Data

Apr. 28, 2020    (JP) .................... 2020-079287

(51) Int. Cl.
| | | |
|---|---|---|
| *C23C 14/14* | (2006.01) | |
| *C23C 14/58* | (2006.01) | |
| *C23C 16/01* | (2006.01) | |
| *F21V 7/26* | (2018.01) | |
| *F21V 9/32* | (2018.01) | |
| *H01S 5/0225* | (2021.01) | |
| *F21Y 115/10* | (2016.01) | |
| *F21Y 115/30* | (2016.01) | |

(52) U.S. Cl.
CPC .......... *C23C 14/5873* (2013.01); *C23C 14/14* (2013.01); *C23C 14/588* (2013.01); *C23C 16/01* (2013.01); *F21V 7/26* (2018.02); *F21V 9/32* (2018.02); *H01S 5/0225* (2021.01); *F21Y 2115/10* (2016.08); *F21Y 2115/30* (2016.08)

(58) Field of Classification Search
CPC ................ C23C 14/14; C23C 14/5873; H01L 2933/0041; H01L 2933/0058; H01L 33/505; H01L 33/60
See application file for complete search history.

(56) References Cited

U.S. PATENT DOCUMENTS

| | | |
|---|---|---|
| 2009/0116107 A1 | 5/2009 | Kindler et al. |
| 2011/0114840 A1 | 5/2011 | Yamazaki et al. |
| 2012/0074105 A1 | 3/2012 | Okamoto et al. |

(Continued)

FOREIGN PATENT DOCUMENTS

| | | |
|---|---|---|
| JP | 2004-122173 A | 4/2004 |
| JP | 2006-245368 A | 9/2006 |

(Continued)

*Primary Examiner* — Jaehwan Oh
(74) *Attorney, Agent, or Firm* — Global IP Counselors, LLP

(57) ABSTRACT

A method for manufacturing a wavelength conversion member, includes: providing a wavelength conversion layer having a phosphor-containing portion and a light reflecting portion surrounding the phosphor-containing portion, and the wavelength conversion layer having an upper surface, a bottom surface and at least one side surface; forming a light-blocking film on the upper surface of the wavelength conversion layer; and removing a part of the light-blocking film by laser processing to expose at least a part of the phosphor-containing portion from the light-blocking film.

17 Claims, 6 Drawing Sheets

(56) References Cited

U.S. PATENT DOCUMENTS

| | | | |
|---|---|---|---|
| 2013/0285091 A1 | 10/2013 | Akimoto et al. | |
| 2016/0084451 A1* | 3/2016 | Annen | F21S 41/16 362/553 |
| 2017/0241621 A1 | 8/2017 | Yamada et al. | |
| 2018/0090649 A1* | 3/2018 | Nishioka | H01L 33/58 |
| 2018/0114692 A1 | 4/2018 | Kitamura et al. | |
| 2018/0252372 A1 | 9/2018 | Noguchi et al. | |
| 2019/0302697 A1 | 10/2019 | Larriere et al. | |
| 2020/0020836 A1* | 1/2020 | Nishioka | H01L 33/60 |

FOREIGN PATENT DOCUMENTS

| | | |
|---|---|---|
| JP | 2006330560 A | 12/2006 |
| JP | 2008-066628 A | 3/2008 |
| JP | 2009-265392 A | 11/2009 |
| JP | 2010-132525 A | 6/2010 |
| JP | 2011-111341 A | 6/2011 |
| JP | 2013210657 A | 10/2013 |
| JP | 2013-232539 A | 11/2013 |
| JP | 2016-001750 A | 1/2016 |
| JP | 2016-066480 A | 4/2016 |
| JP | 2017-149929 A | 8/2017 |
| JP | 2018-056268 A | 4/2018 |
| JP | 2018065730 A | 4/2018 |
| JP | 2018-101659 A | 6/2018 |
| JP | 2018-120947 A | 8/2018 |
| JP | 2019-009406 A | 1/2019 |
| WO | 2010/010721 A1 | 1/2010 |
| WO | 2011/004437 A1 | 1/2011 |
| WO | 2018/109065 A1 | 6/2018 |

* cited by examiner

METHOD FOR MANUFACTURING WAVELENGTH CONVERSION MEMBER AND LIGHT EMITTING DEVICE

CROSS-REFERENCE TO RELATED APPLICATIONS

This application claims priority to Japanese Patent Application No. 2020-079287 filed on Apr. 28, 2020, the entire contents of which are hereby incorporated herein by reference.

BACKGROUND

1. Technical Field

The present disclosure relates to a method for manufacturing a wavelength conversion member and a light emitting device.

2. Description of Related Art

Recent years have seen a proposal for a light emitting device that is equipped with a semiconductor laser or the like as the excitation light source, in which the excitation light emitted from the excitation light source is used to perform illumination and so forth.

With this light emitting device, a wavelength conversion member that makes use of a light emitting portion containing a phosphor and a reflective film surrounding the light emitting portion is disposed in front of the excitation light source in order to convert the wavelength of the excitation light emitted from the excitation light source, for example. A light absorbing film is disposed on the surface of the wavelength conversion member on the opposite side from the excitation light source. A configuration is employed in which the reflected light from a projecting lens is absorbed with the light absorbing film, which reduces the influence of the reflected light, and this improves the uniformity of the illuminance of the illumination light (Japanese Unexamined Patent Application Publication No. 2016-66480A). Here, the size of the opening in the light absorbing film is the same as that of the phosphor film, and the light absorbing film is attached to the reflective film with a heat-resistant transparent resin or the like.

SUMMARY

However, with the method for affixing the light absorbing film described in Japanese Unexamined Patent Application Publication No. 2016-66480A, either the positional accuracy is inadequate, or careful alignment is required to obtain sufficient positional accuracy. In the case where the light absorbing film overlaps the phosphor film, the output of the light emitting device will be reduced. Therefore, there is a need for a manufacturing method with which the light absorbing film can be disposed in the proper position more accurately.

The present disclosure was conceived in light of the above problem, and it is an object thereof to provide a method for manufacturing a wavelength conversion member having a light-blocking film that is simple and has improved disposition accuracy, and a method for manufacturing a light emitting device having this wavelength conversion member.

According to one aspect of the present disclosure, a method for manufacturing a wavelength conversion member, includes: providing a wavelength conversion layer having a phosphor-containing portion and a light reflecting portion surrounding the phosphor-containing portion, and the wavelength conversion layer having an upper surface, a bottom surface and at least one side surface; forming a light-blocking film on the upper surface of the wavelength conversion layer; and removing a part of the light-blocking film by laser processing to expose at least a part of the phosphor-containing portion from the light-blocking film.

According to another aspect of the present disclosure, a method for manufacturing a wavelength conversion member, includes: providing a wavelength conversion layer having a phosphor-containing portion and a light reflecting portion surrounding the phosphor-containing portion, the wavelength conversion layer having an upper surface, a bottom surface and at least one side surface; polishing at least one of the upper surface and the bottom surface of the wavelength conversion layer to form the wavelength conversion layer defining a concave portion or a convex portion; forming a metal film on the upper surface of the wavelength conversion layer; and removing a part of the metal film by laser processing to expose at least a part of the phosphor-containing portion from the metal film.

According to another aspect of the present disclosure, a method for manufacturing a light emitting device, includes providing the wavelength conversion member manufactured by the method as described above, providing a light emitting element configured to emit light; and fixing positions of the wavelength conversion member and the light emitting element so that the phosphor-containing portion of the wavelength conversion member is irradiated with light from the light emitting element.

According to certain embodiments of the present disclosure, it is possible to provide a method for manufacturing a wavelength conversion member having a light-blocking film that is simple and has improved disposition accuracy, and a method for manufacturing a light emitting device having this wavelength conversion member.

DETAILED DESCRIPTION OF EMBODIMENTS

Figure 1A:
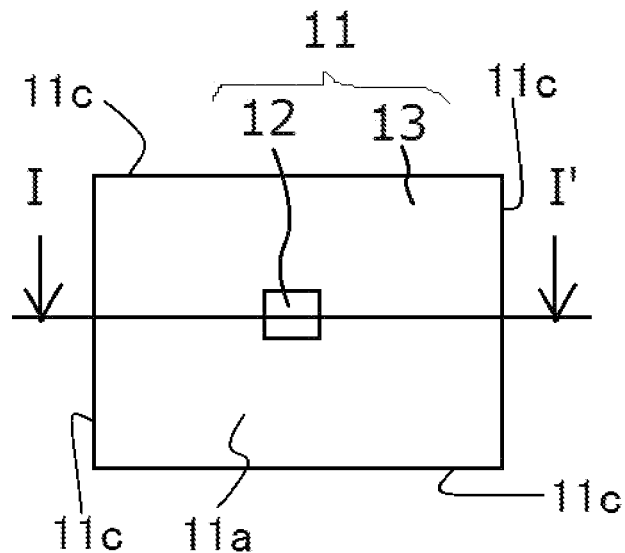
FIG. 1A is a plan view of a wavelength conversion layer, for illustrating a method for manufacturing a wavelength conversion member in an embodiment of the present disclosure.

Certain embodiments of the present disclosure will be explained below with reference to the accompanying drawings. The embodiments below, however, are exemplary illustrations provided for the purpose of giving shape to the technical ideas of the present invention, and are not intended to limit the present invention to those described below. The same designations and reference numerals, as a basic rule, denote the same or similar members or components, for which a redundant explanation will be omitted as appropriate. The sizes and positional relationship of members shown in each drawing might be exaggerated for clarity of explanation. Furthermore, phosphor-containing portion and a light reflecting portion have an upper surface, a bottom surface, and side surfaces similar to the top, the bottom and the side surfaces in a wavelength conversion layer.

The method for manufacturing a wavelength conversion member in one embodiment includes the steps of: providing a wavelength conversion layer having a phosphor-containing portion and a light reflecting portion that surrounds the phosphor-containing portion, and having an upper surface, a bottom surface and a side surface; forming a light-blocking film on the upper surface of the wavelength conversion layer; and removing a part of the light-blocking film by laser processing to expose at least a part of the phosphor-containing portion from the light-blocking film.

Manufacturing a wavelength conversion member with this manufacturing method makes it possible to improve the disposition accuracy of the light-blocking film with a simple method.

Providing Wavelength Conversion Layer 11

Figure 1B:
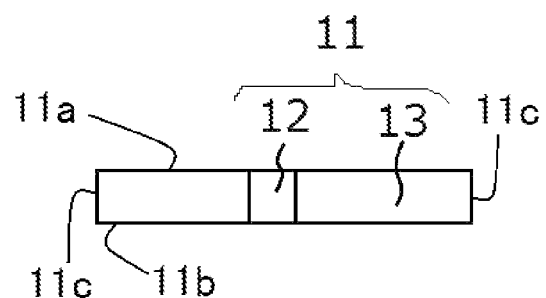
FIG. 1B is a cross-sectional view along the I-I' line in FIG. 1A.

As shown in FIGS. 1A and 1B, a wavelength conversion layer 11 has a phosphor-containing portion 12 and a light reflecting portion 13 that surrounds the phosphor-containing portion 12.

As long as the wavelength conversion layer 11 has an upper surface 11$a$, a bottom surface 11$b$, and at least one side surfaces 11$c$, the wavelength conversion layer 11 may have any of various shapes, such as a circular or elliptical shape, or may be triangular, quadrangular, or have some other such polygonal shape in a plan view. Also, the three-dimensional shape can be any of various shapes, such as cuboid, a cube shape, a columnar or cylindrical shape, or a frustum shape. Of these, a cuboid shape is preferable. The upper surface 11$a$ and the side surface 11$e$ do not have to be flat, but the bottom surface 11$b$ is preferably flat. This is because the heat generated by the wavelength conversion layer 11 is brought into contact over a wide area with a member that can dissipate heat on the bottom surface 11$b$, allowing heat to be dissipated efficiently.

Phosphor-Containing Portion 12

The phosphor-containing portion 12 converts the light incident on the phosphor-containing portion 12 of the wavelength conversion layer 11 into light of a different wavelength. The phosphor-containing portion 12 can be formed by using various materials, such as inorganic materials and organic materials, but being formed from an inorganic material is preferable in terms of being resistant to decomposition by the heat generated during irradiation with light.

Examples of inorganic materials include ceramics containing a phosphor, and single crystals of a phosphor. For example, in the case where a ceramic is used as the phosphor-containing portion 12, an example includes a ceramic which is sintered a phosphor and a light-transmissive material such as aluminum oxide ($Al_2O_3$, melting point: about 1900 to 2100° C.). Specific examples include ceramics containing a YAG phosphor. An example of the amount in which the phosphor is contained is 0.05 to 50 vol % with respect to the total volume of the ceramic. Also, an example may include a ceramic which is sintered substantially composed of only a phosphor. In the case where single crystals of a phosphor are used as the phosphor-containing portion 12, the resulting phosphor-containing portion will have less scattering than in the case where a ceramic is used. With a configuration such as this, the heat resistance will be higher than that of a member made from a resin containing a phosphor, so the product can be used for a relatively long time for the purpose of laser light irradiation.

The phosphor contained in the phosphor-containing portion 12 can be any phosphor known in this field. Examples include a cerium-activated yttrium aluminum garnet (YAG) phosphor, a cerium-activated lutetium aluminum garnet (LAG) phosphor, and a europium-activated silicate phosphor. Of these, it is preferable to use a YAG phosphor, which is a phosphor having good heat resistance. Two or more phosphors may be contained in the phosphor-containing portion 12.

The plan-view shape of the phosphor-containing portion 12 can be, for example, circular or elliptical, a polygonal shape such as triangular or quadrangular, or any of various other shapes. The plan-view shape of the phosphor-containing portion 12 can be quadrangular, for example. The upper surface, the side surface, and the bottom surface of the phosphor-containing portion 12 do not have to be flat, but may be flat. The upper and the bottom surfaces of the phosphor-containing portion 12 can be parallel to each other. The side surface of the phosphor-containing portion 12 may be perpendicular to the upper surface, or may be inclined so as to spread outward or inward, or may have a curved surface. The size of the phosphor-containing portion 12 may be, for example, 0.25 to 2 mm on one side or in diameter in a planar shape.

When strength is taken into account, the thickness of the phosphor-containing portion 12 is at least 0.2 mm, for example. The thickness of the phosphor-containing portion 12 is preferably no more than 1 mm in order to minimize increases in cost and height and to keep the extend of wavelength conversion to an appropriate level.

Figure 1C:
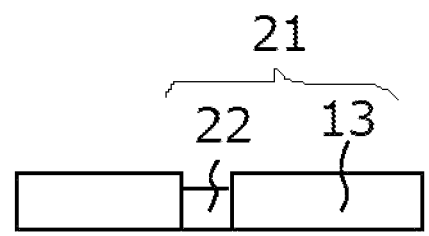
FIG. 1C is a cross-sectional view of a modification example of the wavelength conversion layer shown in FIG. 1A.
Figure 1D:
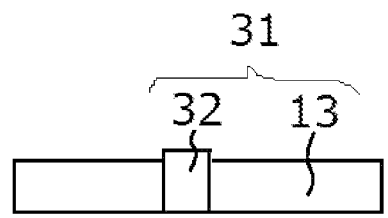
FIG. 1D is a cross-sectional view of another modification example of the wavelength conversion layer shown in FIG. 1A.

As shown in FIG. 1B, the upper surface and/or bottom surface of the phosphor-containing portion 12 may be flush with the upper surface and/or bottom surface of the light reflecting portion 13. As shown in FIG. 1C, the phosphor-containing portion 12 may define a concave portion that is recessed from the upper surface and/or bottom surface of the light reflecting portion 13. As shown in FIG. 1D, the phosphor-containing portion 32 may define a convex portion that sticks out from the light reflecting portion 13.

Light Reflecting Portion 13

The light reflecting portion 13 has an upper surface, a bottom surface, an outer surface, and an inner surface. In other words, the light reflecting portion 13 can have a shape having a through-hole in the central portion of a flat plate.

The side surface, by which the through-hole is defined, corresponds to the inner surface, is in contact with the side surface of the phosphor-containing portion 12, and surrounds the phosphor-containing portion 12. The through-hole can have any of various shapes in plan view, such as circular, elliptical, or a polygonal shape such as quadrangular, depending on the planar shape of the phosphor-containing portion 12. Examples of the outer shape of the light reflecting portion 13 include various shapes, such as a circular or elliptical shape, or may be triangular, quadrangular, or have some other such polygonal shape. The outer shape of the light reflecting portion 13 can be, for example, quadrangular. The upper surface and the outer surface of the light reflecting portion 13 do not have to be flat, but the bottom surface is preferably flat. This makes it easier to join the bottom surface of the light reflecting portion 13 to another member, such as a package 44. The size of the light reflecting portion 13 is 1 to 10 mm on one side or in diameter in a planar shape, for example. When strength is taken into account, the thickness of the light reflecting portion 13 is at least 0.2 mm, for example. The thickness of the light reflecting portion 13 is preferably no more than 1 mm in order to minimize increases in cost and thickness.

The light reflecting portion 13 can be formed, for example, from metal, ceramic, resin, glass, or a composite material including one or more of these. Of these, when high thermal conductivity and integral molding with the phosphor-containing portion 12 are taken into account, the light reflecting portion 13 is preferably formed by a ceramic. Examples of the main material of the ceramic include aluminum oxide, aluminum nitride, silicon nitride, and silicon carbide, and aluminum oxide (alumina) is used, for example. The light reflecting portion 13 may be used as a light reflecting material by, for example, adding a high-refractive index material having a higher refractive index than the main material of the ceramic to this main material. Examples of high-refractive index materials include those whose refractive index is at least 1.8, or at least 2.0. The difference in refractive index between the high-refractive index material and the main material of the ceramic is, for example, at least 0.4, or at least 0.7. Examples of high-refractive index materials include zirconium oxide, yttrium oxide, and lutetium oxide. The high-refractive index material may be voids filled with air or another such gas. Specific examples of the light reflecting portion 13 include white alumina ceramic.

In the case where the light reflecting portion 13 is formed from a ceramic, its light reflecting property can be controlled by adjusting the density of the internal voids. The density of the voids can be adjusted by varying how much the ceramic material is compacted. The voids can be confirmed, for example, by observing a cross-sectional view of the specimen with a scanning electron microscope (SEM).

This wavelength conversion layer 11 can be manufactured, for example, by the following method, the methods described in JP-A 2017-149929. JP-A 2019-9406, etc., by a method similar to these methods, etc. In this case, just one phosphor-containing portion 12 may be formed, or a plurality of phosphor-containing portions 12 may be formed, after which the light reflecting portion 13 may be cut to be divided into a plurality of wavelength conversion members each having a phosphor-containing portion 12.

For example:
(a) First, a phosphor-containing portion 12 having an upper surface, a bottom surface, and a side surface is provided. A plurality of phosphor-containing portions 12 may be provided. The phosphor-containing portion 12 is, for example, a sinter containing a ceramic and a phosphor, etc. The phosphor-containing portion at this point may be an unsintered molded product. Then, a composite molded body containing a powder composed of an inorganic material is formed so as to come into contact with the phosphor-containing portion 12 and to surround the periphery thereof, that is, on the side of the phosphor-containing portion 12 and under and/or above the phosphor-containing portion 12. After this, the composite molded body is sintered to form a wavelength conversion layer 11 having a phosphor-containing portion and a light reflecting portion that surrounds this phosphor-containing portion, and having an upper surface, a bottom surface and side surfaces, or (b) A light reflecting portion 13 having recesses and protrusions, e.g., unevenness, is provided. The light reflecting portion 13 is, for example, a sinter containing a ceramic. The light reflecting portion at this point may be an unsintered molded product. Then, a powder containing an inorganic material and a phosphor is disposed in the concave portion of the light reflecting portion 13 to form a composite molded body. After this, the composite molded body is sintered to form a wavelength conversion layer 11 having a phosphor-containing portion 12 and a light reflecting portion 13 that surrounds this phosphor-containing portion 12, and having an upper surface, a bottom surface and side surfaces.

This manufacturing method allows the phosphor-containing portion 12 and the light reflecting portion 13 to be made into a sinter, and preferably an integral sinter. Also, this can suppress the phosphor-containing portion 12 from shifting from its initial position, which makes it easier to manufacture the wavelength conversion layer 11 with the light reflecting portion 13 and the phosphor-containing portion 12 disposed in their proper positions. The term "integral sinter" here refers to a body in which sinters (ceramic) are integrated without the use of an adhesive, and is formed by integral sintering. This sintering can be accomplished, for example, by spark plasma sintering (SPS method), hot press sintering (HP method), normal pressure sintering, gas pressure sintering, or the like.

The side surface of the phosphor-containing portion 12 is surrounded by the light reflecting portion 13, but the upper surface and/or bottom surface of the phosphor-containing portion 12 may also be covered by the light reflecting portion 13. In this case, the upper surface and the bottom surface of the phosphor-containing portion 12 are exposed from the light reflecting portion 13 by polishing or the like.

As shown in FIG. 1B, the polishing or the like here can be performed so that the upper surface and the bottom surface of the phosphor-containing portion 12 are exposed from the light reflecting portion 13. The phosphor-containing portion 12 may be exposed from the light reflecting portion 13 such that the upper surface of the phosphor-containing portion 12 is flush with the upper surface of the light-reflecting portion 13, and/or such that the bottom surface of the phosphor-containing portion 12 is flush with the bottom surface of the light-reflecting portion 13.

Also, in the case where the material, the void ratio, or so forth are different between the phosphor-containing portion 12 and the light reflecting portion 13, the rate of removal in the polishing or the like may also be different. In the case where the phosphor-containing portion 22 is removed faster than the upper surface and/or the bottom surface of the light reflecting portion 13, there will be a concave portion that is recessed from the upper surface and/or the bottom surface of the light reflecting portion 13, as shown in FIG. 1C. On the other hand, in the case where the phosphor-containing portion 12 is removed more slowly than the upper surface and/or the bottom surface of the light reflecting portion 13, there will be a convex portion sticking out from the upper surface and/or the bottom surface of the light reflecting portion 13, as shown in FIG. 1D. In other words, by polishing one surface of the wavelength conversion layer 11 obtained as a sinter, a convex portion or a concave portion can be formed on that surface. In this case, the concave portion and the convex portion have, for example, a depth or height in the range of 0.1 to 5 µm, and the depth or height is preferably in the range of 0.1 to 1 µm.

As described above, the phosphor-containing portion 12 and the light reflecting portion 13 are both a ceramic sinter, but it is preferable for at least one of the following magnitude relations to be satisfied, and all of them may be satisfied. (1) The density of the phosphor-containing portion 12 is higher than that of the light reflecting portion 13. (2) The phosphor-containing portion 12 has a smaller void ratio than the light-reflecting portion 13. (3) The phosphor-containing portion 12 has a higher strength than the light reflecting portion 13.

To impart the magnitude relationship such as the above, the sintering conditions such as temperature, pressure and heat treatment duration may be adjusted. For instance, in the case where sintering is performed by pressure at a lower pressure, the sinter tends to contain more voids, and the void ratio (here, the porosity of the sinter) increases. Also, in the case where sintering is performed by heat treatment at a high temperature for a short time, the particle size will be smaller and the average particle size will also be smaller. Also, to make the processing conditions different between the phosphor-containing portion 12 and the light-reflecting portion 13, it is preferable for either the phosphor-containing portion 12 or the light-reflecting portion 13 to be sintered first, and the other one sintered after that.

The phosphor-containing portion 12 can be formed, for example, so that the void ratio is from 0% to 5%. Also, the light reflecting portion 13 can be formed so that the void ratio is from 5% to 20%. The void ratio of the phosphor-containing portion 12 may be 5% or more lower than that of the light-reflecting portion 13. The void ratio at the contact surface between the phosphor-containing portion 12 and the light reflecting portion 13, that is, in the region near the side surface of the phosphor-containing portion 12, may be 5% or more lower than that in the region near the inner surface of the light reflecting portion 13.

The void ratios of the phosphor-containing portion 12 and the light-reflecting portion 13 can be measured, for example, by the Archimedes method. These void ratios may be determined from an SEM image of a cross-sectional view.

Figure 1E:
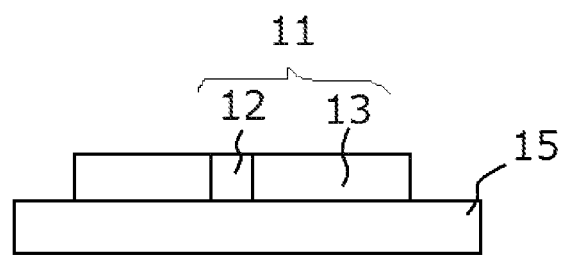
FIG. 1E is a cross-sectional view of yet another modification example of the wavelength conversion layer according to an embodiment.

After the wavelength conversion layer 11 is thus provided, the wavelength conversion layer 11 may be further placed and fixed on a substrate 15 as shown in FIG. 1E at any stage, such as after the step described below. In this case, it is preferable for the wavelength conversion layer 11, and particularly the phosphor-containing portion 12, and especially the bottom surface of the light reflecting portion 13, to be fixed so as to be in contact with the upper surface of the substrate 15. Consequently, the heat generated by the phosphor-containing portion 12 can escape into the substrate 15, so the temperature of the phosphor-containing portion 12 does not rise as much. Fixing may be accomplished by providing an adhesive and joining, or direct joining may be performed. Examples of the adhesive here include a metal adhesive such as Au—Sn, a resin adhesive containing a curable resin as the main material, and so forth. Direct bonding refers to bonding without the use of an adhesive, and various direct bonding methods can be used.

Examples of the substrate 15 include one having a bottom surface, an upper surface, and a side surface, that is, a plate-shaped substrate. The upper surface of the substrate 15 on which the wavelength conversion layer 11 is placed is preferably flat. With such a shape, it is easier to join to the wavelength conversion layer 11, and thermal connection can be made over a relatively large surface area. This allows the heat of the phosphor-containing portion 12 and/or the light reflecting portion 13 to be dissipated efficiently to the substrate 15. The bottom surface and the side surface of the substrate 15 do not have to be flat.

The substrate 15 can be formed, for example, from metal, sapphire, quartz, silicon carbide, glass, or the like. The substrate 15 can have a light-transmissive region through which light is transmitted from the upper surface to the bottom surface. This allows the excitation light to be incident from the bottom surface of the substrate 15 and reach the phosphor-containing portion 12. Here, the term "light-transmissive" means that the transmittance with respect to the incident light (excitation light) is at least 80%. Using light-transmissive sapphire for the substrate 15 is especially preferable.

Forming Light-Blocking Film 14

Figure 2A:
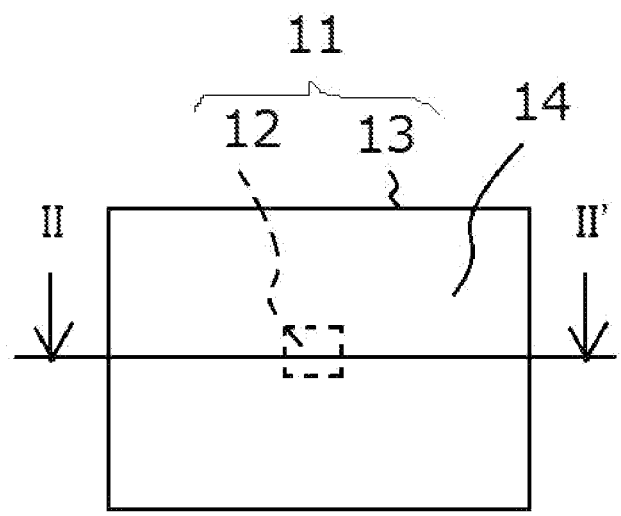
FIG. 2A is a plan view of a wavelength conversion layer on which a light-blocking film has been formed, for illustrating the method for manufacturing a wavelength conversion member in an embodiment of the present disclosure.
Figure 2B:
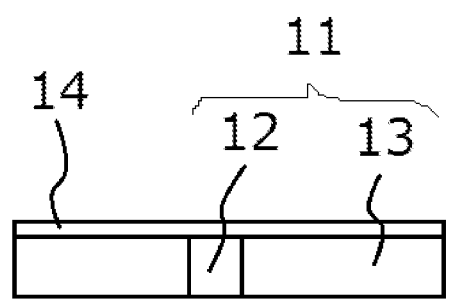
FIG. 2B is a cross-sectional view along the II-II' line in FIG. 2A.

Next, as shown in FIGS. 2A and 2B, a light-blocking film 14 is formed on the entire upper surface of the wavelength conversion layer 11.

The light-blocking film 14 is a film having the ability to block the light from the phosphor-containing portion 12. The light from the phosphor-containing portion 12 includes excitation light as well as fluorescent light emitted when the phosphor is excited by the excitation light. The light-blocking film 14 can be any film having a transmittance of 10% or less for these two types of light. The material of the light-blocking film 14 can be, for example, a dark-colored resin such as a black resin, or a metal. Using these materials allows the material constituting the wavelength conversion layer 11 to be selectively removed by laser processing, for example. The light-blocking film 14 is preferably formed by a metal film. A metal film has higher resistance to heat than a resin, and is more suitable in the case where a laser element is used as the excitation light source.

Examples of the metal film forming the light-blocking film 14 include a single-layer film or a stacked-layer film of a metal or alloy of aluminum, titanium, or nickel. These metal films can be formed by sputtering, vacuum vapor deposition, or the like. Since the light-blocking film 14 is partially removed in the step described below, the light-blocking film 14 does not need to be patterned during its formation. The light-blocking film 14 can be formed on the entire upper surface of the wavelength conversion layer 11, for example.

The light-blocking film 14 can be formed in a thickness of 0.1 to 10 µm, for example, with 0.5 to 1 µm being preferable. This can more reliably ensure that the light will be blocked.

Exposing Phosphor-Containing Portion 12 from Light-Blocking Film 14

Figure 3A:
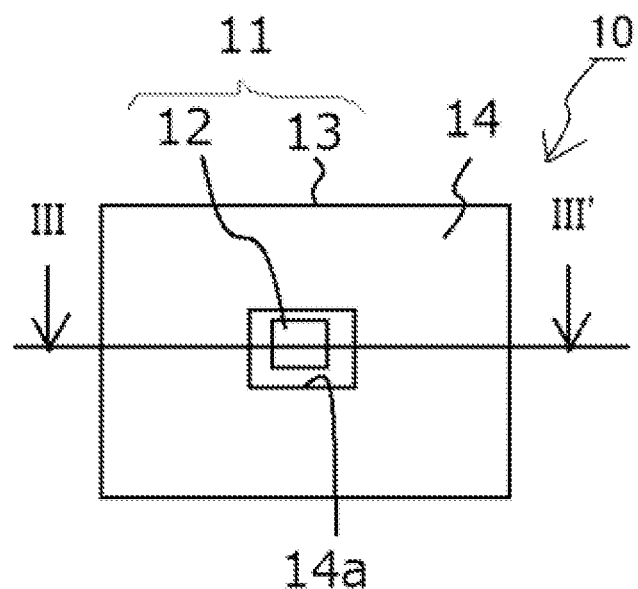
FIG. 3A is a plan view of a wavelength conversion member, for illustrating the method for manufacturing the wavelength conversion member in an embodiment of the present disclosure.
Figure 3B:
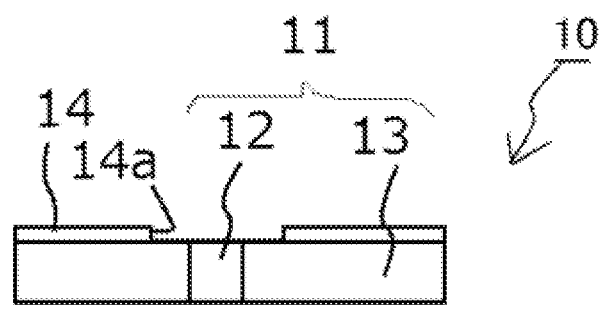
FIG. 3B is a cross-sectional view along the III-III' line in FIG. 3A.

Then, as shown in FIGS. 3A and 3B, a part of the light-blocking film 14 is removed to expose at least a part of the phosphor-containing portion 12 from the light-blocking film 14.

The light-blocking film 14 is preferably removed by laser processing. In the case of laser processing, unlike the case where the light-blocking film 14 is patterned by photolithography, there is no need to form a photoresist or other such mask, so the light-blocking film 14 can be patterned in fewer steps. Also, in the case where the light-blocking film 14 is patterned by photolithography, the photoresist and/or the developing solution may remain in the gaps and surface protrusions and recesses of the phosphor-containing portion 12 and/or the light reflecting portion 13. With laser processing, such residue can be avoided. This can also avoid the occurrence of improper patterning of the light-blocking film 14 caused by the residual photoresist and/or developing solution, so a decrease in processing accuracy due to these residues can be avoided. Also, if the photoresist and/or developing solution remains on the wavelength conversion layer 11, the wavelength conversion layer 11 may be discolored, but this can also be avoided by performing laser processing. In particular, as described above, in the case where the phosphor-containing portion 12 and/or the light reflecting portion 13 contains voids, it will be more likely that some photoresist or the like will be left behind during photolithography. Therefore, particularly in the case where the phosphor-containing portion 12 and/or the light reflecting portion 13 contains voids, it is preferable to remove some of the light-blocking film 14 by laser processing. This can improve the accuracy with which the light-blocking film 14 is processed, so the disposition accuracy of the light-blocking film 14 can be improved.

In the laser processing, methods, conditions, and so forth that are known in this field can be used. For example, laser processing can be performed by using a cylindrical liquid jet as a light guide path and irradiating the light-blocking film with the laser beam through the cylindrical liquid jet. The method used for this can be, for example, the so-called laser microjet processing described in WO 2011/004437, JP-A 2004-122173, etc. The type of light source, the processing width, and other such conditions in the laser microjet processing can be appropriately adjusted depending on the thickness, material, and so forth of the light-blocking film 14. The use of laser microjet processing can reduce the influence of heat as compared with laser processing in which no liquid is used, and can suppress deterioration of or damage to the phosphor-containing portion 12 that would be caused by heat. Also, since any debris or burrs produced during the processing of the light-blocking film 14 can be reduced, the light-blocking film 14 can be processed more accurately.

As described above, there may be a convex portion or concave portion on the surface of the light-blocking film 14 due to the convex portion of the phosphor-containing portion 12 sticking out from the upper surface and/or bottom surface of the light reflecting portion 13 constituting the wavelength conversion layer 11. In this case, the contrast due to the unevenness is subjected to image recognition, and the position of the phosphor-containing portion 12 can be identified from the contrast of the resulting image. Then, the light-blocking film 14 that covers the phosphor-containing portion 12 can be removed on the basis of the identified position. Being able to identify the position of the phosphor-containing portion 12 from above the light-blocking film 14 in this way allows part of the light-blocking film 14 be removed more accurately. Also, automatic operation can be performed by using image recognition.

The exposure of the phosphor-containing portion 12 from the light-blocking film 14 can be, for example, 20% to 100% of the flat surface area of the phosphor-containing portion 12. Also, the phosphor-containing portion 12 can be exposed over a range of 0.1 to 0.5 mm2. A part of the phosphor-containing portion 12 may be covered by the light-blocking film 14. Providing the light-blocking film 14 allows the light emitted from the upper surface of the light reflecting portion 13 to be block, and also allows the light from the outside to be blocked so as not to be reflected at the upper surface of the light reflecting portion 13. This can improve the visibility and sharpness of the light emitted by the wavelength conversion member 10 when the wavelength conversion member 10 is combined with an excitation light source. Preferably, the entire phosphor-containing portion 12 is exposed from the light-blocking film 14. This can suppress the light emitted from the upper surface of the phosphor-containing portion 12 from being blocked by the light-blocking film 14. In this case, the light reflecting portion 13 may not be exposed, and the outer edge of the phosphor-containing portion 12 may coincide with the edge of the light-blocking film 14 after partial removal. Also, not only the phosphor-containing portion 12, but also a part of the light reflecting portion 13 surrounding the phosphor-containing portion 12 may be exposed from the light-blocking film 14. In this case, the exposed surface area of the light reflecting portion 13 is preferably small, in order to improve the visibility and sharpness of the light emitted by the wavelength conversion member 10. More specifically, the distance from the outer edge of the phosphor-containing portion 12 to the edge of the light-blocking film 14 can be 100 µm or less, with 50 µm or less being preferable. The distance from the outer edge of the phosphor-containing portion 12 to the edge of the light-blocking film 14 may be 10 µm or more. This allows the entire phosphor-containing portion 12 to be more reliably exposed from the light-blocking film 14. The distance from the outer edge of the phosphor-containing portion 12 to the edge of the light-blocking film 14 may be the same at all the outer edges of the phosphor-containing portion 12, or may be different for some. For example, in the case where the planar shape of the phosphor-containing portion 12 is quadrangular, the distance from the outer edge of the phosphor-containing portion 12 to the edge of the light-blocking film 14 on one or two sides of this quadrangle may be less than or greater than the distance at the other sides. It is preferable either for a portion of the outer edge of the phosphor-containing portion 12 to coincide with the edge of the light-blocking film 14, or for the distance from the outer edge of the phosphor-containing portion 12 to the edge of the light-blocking film 14 to be 50 µm or less. The word "coincide" here means that a deviation of about ±10 µm of distance is allowed.

This manufacturing method makes it possible to obtain a wavelength conversion member having a light-blocking film that is simple and has improved disposition accuracy.

The wavelength conversion member 10 manufactured by the manufacturing method described above can be used, for example, in a light emitting device including a light source that irradiates the phosphor-containing portion 12 of the wavelength conversion member 10 with light.

The method for manufacturing a light emitting device can include a step of providing a wavelength conversion member, a step of providing a light emitting element that emits light, and a step of fixing the wavelength conversion member and the light emitting element at a position where the phosphor-containing portion of the wavelength conversion member will be irradiated with light from the light emitting element.

Figure 4:
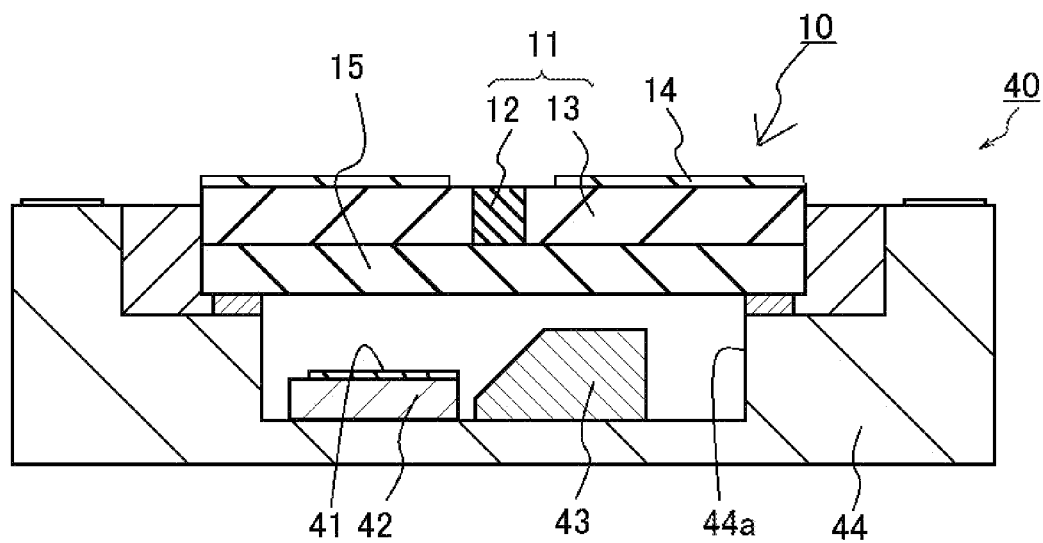
FIG. 4 is a schematic cross-sectional view of a light emitting device including a wavelength conversion member manufactured by the method for manufacturing a wavelength conversion member in an embodiment of the present disclosure.

A light emitting device 40 including a wavelength conversion member 10 as a transmission type of wavelength conversion member is an example of such a light emitting device, as shown in FIG. 4. This light emitting device 40 has a wavelength conversion member 10 and a light emitting element 41 that irradiates the phosphor-containing portion 12 of the wavelength conversion member 10 with excitation light. In this case, the phosphor-containing portion 12 is preferably formed from a ceramic because this will impart a good scattering effect.

The wavelength conversion member 10 and the light emitting element 41 are housed or placed in a package 44 constituting the light emitting device 40. The package 44 has a concave portion 44a that is open on the upper surface side. The wavelength conversion member 10 is disposed so as to cover the concave portion 44a from above. The package 44 can be formed mainly from a ceramic such as aluminum oxide, aluminum nitride, silicon nitride, or silicon carbide, or a metal such as copper. The package 44 can have any of various top view shapes, such as a quadrangular shape. In the package 44, electrodes and the like for supplying electric current to the light emitting element 41 are disposed on the bottom surface, the wall portions, and/or the upper surface of the concave portion 44a. The wavelength conversion member 10 is disposed at a position that blocks off the concave portion 44a. The wavelength conversion member 10 is fixed to the package 44 by a metal joining layer, for example. Examples of the metal joining layer include solders such as those based on Sn—Bi. Sn—Cu, or Sn—Ag, alloys containing gold and tin as the main components, alloys containing gold and silicon as the main components, alloys containing gold and germamum as the main components, and other such eutectic alloys, brazing materials of low-melting point metals, and adhesive agents in which these are combined.

Examples of the light emitting element 41 include a light emitting diode (LED) and a semiconductor laser element, with a semiconductor laser element being preferable. In the case where the light emitting element 41 is a semiconductor laser element, the phosphor-containing portion 12 can be efficiently irradiated with light. The light emitting element 41 may be disposed directly on the bottom surface of the concave portion 44a of the package 44, but may be instead be disposed on a submount 42. The laser light emitted from the semiconductor laser element, which is the light emitting element 41, is mounted so as to travel in a direction substantially parallel to the bottom surface of the package 44. Examples of the submount 42 include those formed using SiC, AlN, or the like as the main material. The light emitting element 41 can be mounted on the submount 42 by using AuSn eutectic solder or the like, for example.

The light emitting element 41 is disposed so that the end surface from which the laser light is emitted is opposite the inclined surface of the reflection member 43 disposed in the concave portion 44a of the package 44. Consequently, the laser light emitted from the light emitting element 41 irradiates the reflection member 43, and the reflection member 43 reflects the laser light in the direction of the wavelength conversion member 10 fixed to the upper surface side of the package 44, which allows the phosphor-containing portion 12 of the wavelength conversion member 10 to be irradiated with excitation light. The reflective member 43 can be a member having a reflective film provided on the inclined surface of a main body made of glass, silicon, or the like in the shape of a triangular prism, a quadrangular pyramid or the like. The reflective film can be a single-layer or multi-layer dielectric film, metal film, or the like. In FIG. 4, the direction in which the laser beam is emitted from the light emitting element 41 is to the right in the drawing, but the light emitting element 41 may instead be disposed so as to emit the laser light in upward in the drawing, in which case the reflecting member 43 is unnecessary.

Figure 5:
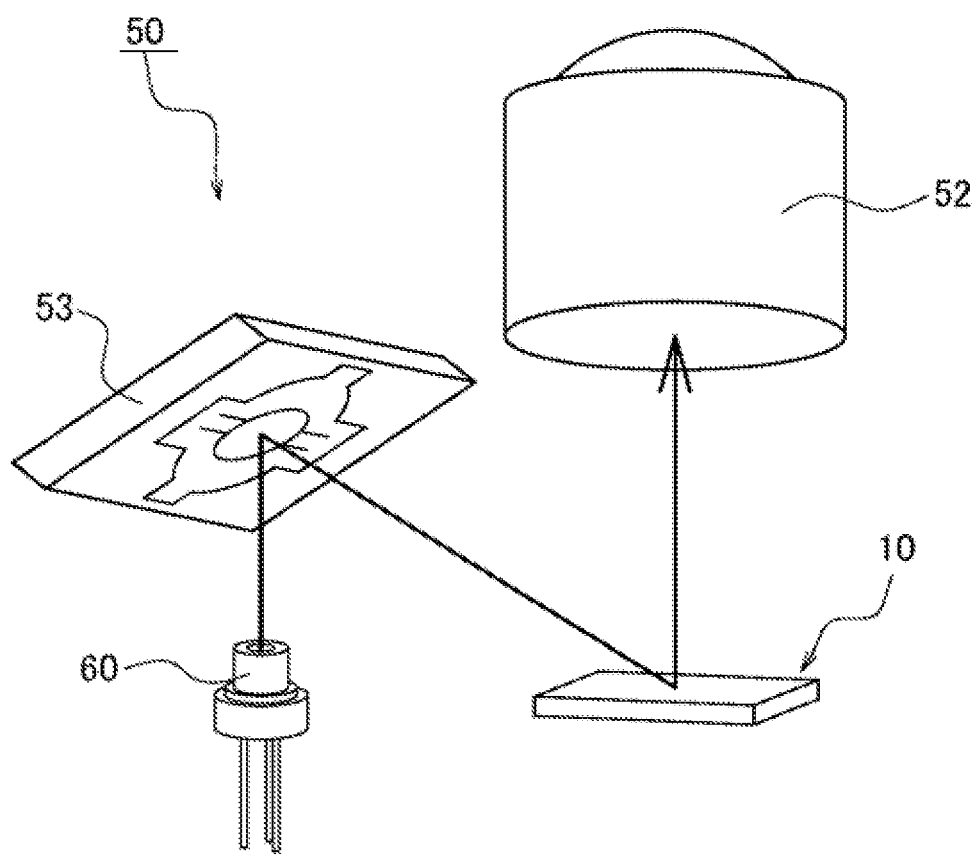
FIG. 5 is a schematic oblique view of another light emitting device including a wavelength conversion member manufactured by the method for manufacturing a wavelength conversion member in an embodiment of the present disclosure.

Another example of a light emitting device, as shown in FIG. 5, for example, is a light emitting device 50 including the wavelength conversion member 10 as a reflection type wavelength conversion member.

The light emitting device 50 can emit the light emitted from a light source 60 to the outside through an optical member 52 that can change to the desired light distribution or the like. Also, a spatial light modulator 53 may be disposed between the light source 60 and the wavelength conversion member 10 so that the light emitted from the light source 60 is incident at a specific angle on the wavelength conversion member 10. The light source 60 has a light emitting element. The wavelength conversion member 10 in the light emitting device 50 has, for example, a light reflecting structure such as a reflective film on the surface on the opposite side from the surface on which the light from the light source 60 is incident. The wavelength conversion member 10 may be provided with a substrate on the surface on the opposite side from the surface on which the light from the light source 60 is incident.

With this configuration, the light from the light source 60 is incident on the wavelength conversion member 10, and part of this light undergoes wavelength conversion and is reflected or diffused by the phosphor in the phosphor-containing portion, and goes directly to the outside. Even if another part of the light from the light source 60 is incident on the phosphor-containing portion, it will be reflected by the light-reflecting structure and go toward the outside without first undergoing wavelength conversion by the phosphor. This wavelength-converted light can be mixed with light that has not been wavelength-converted, and emitted to the outside as white light, for example. Also, disposing the substrate below the wavelength conversion layer allows the substrate to effectively dissipate heat produced by light irradiation, and allows the function as a light emitting device to be maintained over an extended period.

Examples of the light source 60 include a light emitting diode (LED), a semiconductor laser element, and a package of these, with a semiconductor laser device being preferable. Using a semiconductor laser device allows the surface area of the light incidence surface of the phosphor-containing portion 12 to be smaller than when using an LED, so the light emitting device 50 can be made more compact, while the heat dissipation effect can be efficiently ensured by the thermally conductive portion and the substrate. The spatial light modulator 53 can be any type known in this field.

What is claimed is:

1. A method for manufacturing a wavelength conversion member, comprising:
   providing a wavelength conversion layer having a phosphor-containing portion and a light reflecting portion surrounding the phosphor-containing portion, and the wavelength conversion layer having an upper surface, a bottom surface and at least one side surface;
   forming a light-blocking film on the upper surface of the wavelength conversion layer; and
   removing a part of the light-blocking film by laser processing to expose at least a part of the phosphor-containing portion from the light-blocking film.

2. The method according to claim 1, wherein
   the forming of the light-blocking film includes forming the light-blocking film made of metal.

3. The method according to claim 1, wherein
   the removing of the part of the light-blocking film includes performing the laser processing by using a cylindrical liquid jet as a light guide path and irradiating the light-blocking film with a laser beam through the cylindrical liquid jet.

4. The method according to claim 1, wherein
the providing of the wavelength conversion layer includes providing the wavelength conversion layer having the phosphor-containing portion made of ceramics containing a phosphor or the phosphor-containing portion made of single crystals of a phosphor.

5. The method according to claim 1, wherein
the providing of the wavelength conversion layer includes providing the wavelength conversion layer having the upper surface in which the phosphor-containing portion defines a concave portion that is recessed from the light reflecting portion or a convex portion that sticks out from the light reflecting portion.

6. The method according to claim 5, wherein
the providing of the wavelength conversion layer includes polishing at least the upper surface of the wavelength conversion layer to form the concave portion or the convex portion.

7. The method according to claim 6, wherein
in the polishing, a rate of removal in the polishing the phosphor-containing portion and a rate of removal in the polishing the light reflecting portion are different.

8. The method according to claim 5, wherein
the removing of the part of the light-blocking film includes performing the laser processing by
image-recognizing a contrast due to the concave portion or the convex portion,
identifying a position of the phosphor-containing portion from the contrast of a resulting image, and
removing a portion of the light-blocking film that covers the phosphor-containing portion.

9. The method according to claim 1 wherein
the providing of the wavelength conversion layer includes
providing the phosphor-containing portion having an upper surface, a bottom surface and at least one side surface,
forming a molded body containing a powder composed of an inorganic material on the at least one side surface and the bottom surface of the phosphor-containing portion, and
sintering the molded body.

10. A method for manufacturing a light emitting device, comprising:
providing the wavelength conversion member manufactured by the method according to claim 1;
providing a light emitting element configured to emit light; and
fixing positions of the wavelength conversion member and the light emitting element so that the phosphor-containing portion of the wavelength conversion member is irradiated with light from the light emitting element.

11. A method for manufacturing a wavelength conversion member, comprising:
providing a wavelength conversion layer having a phosphor-containing portion and a light reflecting portion surrounding the phosphor-containing portion, the wavelength conversion layer having an upper surface, a bottom surface and at least one side surface;
polishing the upper surface of the wavelength conversion layer to form the wavelength conversion layer defining a concave portion or a convex portion;
forming a metal film on the upper surface of the wavelength conversion layer; and
removing a part of the metal film by laser processing to expose at least a part of the phosphor-containing portion from the metal film.

12. The method according to claim 11, wherein
the providing of the wavelength conversion layer includes providing the wavelength conversion layer having the phosphor-containing portion made of ceramics containing a phosphor.

13. The method according to claim 11, wherein
the providing of the wavelength conversion layer includes providing the wavelength conversion layer having the phosphor-containing portion and the light reflecting portion so that at least one of a material and a void ratio is different between the phosphor-containing portion and the light reflecting portion.

14. The method according to claim 11, wherein
the removing of the part of the metal film includes performing the laser processing by using a cylindrical liquid jet as a light guide path and irradiating the metal film with a laser beam through the cylindrical liquid jet.

15. The method according to claim 14, wherein
the removing of the part of the metal film includes performing the laser processing by
image-recognizing a contrast due to the concave portion or the convex portion,
identifying a position of the phosphor-containing portion from the contrast of a resulting image, and
removing a portion of the metal film that covers the phosphor-containing portion.

16. The method according to claim 11 wherein
the providing of the wavelength conversion layer includes
providing the phosphor-containing portion having an upper surface, a bottom surface and at least one side surface,
forming a molded body containing a powder composed of an inorganic material on the at least one side surface and the bottom surface of the phosphor-containing portion, and
sintering the molded body.

17. A method for manufacturing a light emitting device, comprising:
providing the wavelength conversion member manufactured by the method according to claim 11;
providing a light emitting element configured to emit light; and
fixing positions of the wavelength conversion member and the light emitting element so that the phosphor-containing portion of the wavelength conversion member is irradiated with light from the light emitting element.

* * * * *